United States Patent [19]

Haugen

[11] Patent Number: 4,777,812
[45] Date of Patent: Oct. 18, 1988

[54] LOCKING SYSTEM FOR AN ENCLOSURE CONTAINING ELECTRICAL EQUIPMENT THEREIN

[75] Inventor: Myron W. Haugen, Devils Lake, N. Dak.

[73] Assignee: Nordic Fiberglass, Inc, Warren, Minn.

[21] Appl. No.: 928,566

[22] Filed: Nov. 10, 1986

[51] Int. Cl.$^4$ ............................................. F16B 41/00
[52] U.S. Cl. ......................................... 70/232; 70/57; 70/77; 70/158; 70/416; 292/251
[58] Field of Search ................... 70/229, 230, 232, 77, 70/158, 163, 164, 166–168, 57, 416, 417, DIG. 57; 292/DIG. 11, 251; 411/84, 85, 103, 107, 544, 352, 353

[56] References Cited

U.S. PATENT DOCUMENTS

| | | | |
|---|---|---|---|
| 1,285,093 | 11/1918 | Fishel | 70/232 X |
| 1,577,292 | 3/1926 | Obreiter | 70/232 X |
| 2,046,078 | 6/1936 | Marshall | 70/416 X |
| 2,285,541 | 6/1942 | Swift | 70/232 X |
| 2,367,127 | 1/1945 | Johansson | 70/DIG. 57 X |
| 3,018,127 | 1/1962 | Dobrosielski et al. | 292/251 |
| 3,181,523 | 5/1965 | Casey | 70/232 |
| 3,264,850 | 8/1966 | Bower | 70/416 X |
| 3,343,581 | 9/1967 | Martin et al. | 292/251 X |
| 3,672,190 | 6/1972 | Palazzolo | 70/232 X |
| 3,782,146 | 1/1974 | Franke | 70/231 X |
| 3,784,727 | 1/1974 | Haubein | 70/DIG. 57 X |
| 3,888,096 | 6/1975 | Huss | 70/416 X |
| 3,889,993 | 6/1975 | Bright | 292/251 |
| 3,927,544 | 12/1975 | Klein | 70/416 |
| 3,996,774 | 12/1976 | Best | 70/416 X |
| 4,005,253 | 1/1977 | Walter | 292/251 X |
| 4,107,959 | 8/1978 | Skarzynski et al. | 70/232 X |
| 4,113,291 | 9/1978 | Cameron | 70/230 X |
| 4,186,843 | 2/1980 | Omori | 70/164 X |
| 4,190,272 | 2/1980 | Beard | 292/251 |
| 4,286,813 | 9/1981 | Wylie | 292/251 |
| 4,313,321 | 2/1982 | Wasser | 70/164 X |
| 4,326,395 | 4/1982 | De Rosa | 70/DIG. 57 X |
| 4,345,448 | 8/1982 | Solomon | 70/416 X |
| 4,616,967 | 10/1986 | Molina | 411/107 X |

FOREIGN PATENT DOCUMENTS 1271223 4/1972 United Kingdom ......... 70/DIG. 57

*Primary Examiner*—Gary L. Smith
*Assistant Examiner*—Suzanne L. Dino
*Attorney, Agent, or Firm*—Peterson, Wicks, Nemer & Kamrath

[57] ABSTRACT

The two-step locking system includes a dual locking unit comprised of a flat plate to which a recessed cover is hinged. The plate has a keeper projecting therefrom and said recessed cover has a slot through which the free end of the keeper extends so that a padlock can be attached to the keeper via a hole therein to prevent the cover from being opened. A sleeve is secured to said plate, the sleeve projecting a lesser distance from the plate than the keeper, so that the sleeve is completely concealed when the cover is closed. A penta-head bolt extends through the plate of the unit into threaded engagement with a tapped hole in a bracket. The plate of the dual locking unit is riveted to one component of a two-component enclosure, and the bracket is riveted to the other component. The tapped hole in the bracket is in registry with the bolt when the two components are mated so as to allow the bolt to be threadedly engaged with the bracket. The bolt can only be removed when the recessed cover is open, and the cover cannot be opened until the padlock has been first removed.

2 Claims, 3 Drawing Sheets

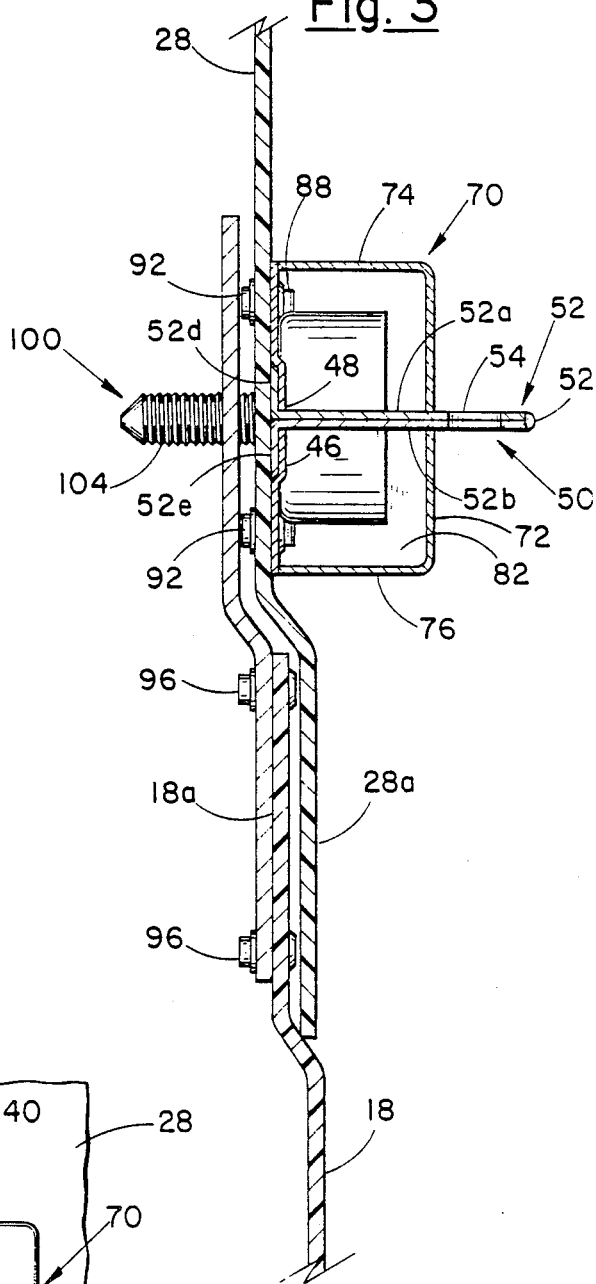
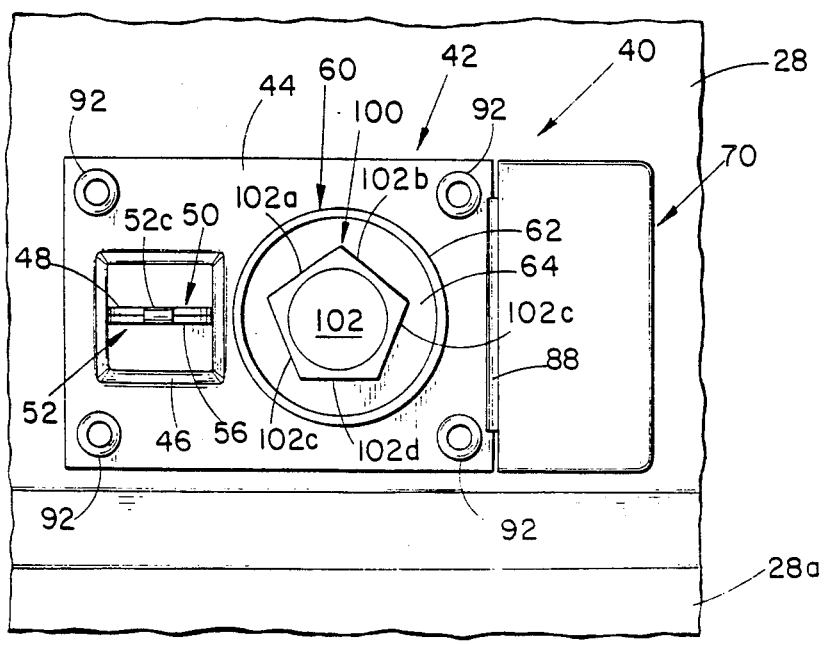

LOCKING SYSTEM FOR AN ENCLOSURE CONTAINING ELECTRICAL EQUIPMENT THEREIN

BACKGROUND OF THE INVENTION

1. Field of the Invention

This invention relates generally to locking systems for preventing unauthorized entry into the interiors of enclosures containing electrical equipment therein, and pertains more particularly to a two-step locking system in which a padlock has to be first removed from a unit mounted on the enclosure in order to gain access to a special locking bolt concealed within the unit which bolt must then be removed in order to gain entry to the enclosure.

2. Description of the Prior Art

In order to protect various types of electrical equipment, such as switchgear, metering, controls and protecting devices, the electrical utility industry has required appropriately designed enclosures, such as upright pedestals, cabinets and terminal boxes, the particular enclosure depending largely upon the type of electrical equipment to be housed and its place of installation.

Both single and double locking systems have been employed. The most common single locking system has made use of a common hasp and staple type of fastener, involving a conventional padlock. When a double locking system is used, the secondary fastener is in the form of a penta-head bolt involving the recessing of a five-sided bolt head so that a special wrench is needed in order to obtain access to the equipment housed within that particular enclosure.

The difficulty with the alluded to prior art dual locking system resides in that each fastener is completely exposed to view. Tampering is made comparatively easy because an unauthorized person can visually ascertain what is needed in the way of tools to obtain entry into the enclosure. Also, such an exposed locking system is vulnerable to adverse weather conditions. Still further, it is needlessly unattractive. Furthermore, the installation of a dual locking system involving both a hasp-type fastener and a five-sided bolt-type fastener increases the manufacturing cost of the enclosure.

SUMMARY OF THE INVENTION

Accordingly, a general object of my invention is to provide a locking system that will effectively thwart unauthorized entry into an enclosure containing electrical equipment therein.

A more specific object is to provide a two-step locking system in which the steps needed to gain access to the enclosure must be performed successively.

Another object of the invention is to expose to view only one part of the locking system, the other part of the system being completely concealed. In this way, a person who should be denied entry to the enclosure cannot conveniently ascertain in advance the presence of the penta-head bolt requiring a specially configured wrench in order to complete the opening of the enclosure. In this regard, a padlock must first be unlocked, removed, a small cover then opened to provide access to the penta-head bolt, and lastly the bolt removed with a special wrench in order to complete the entry process.

Yet another object of the invention is to provide a locking system that will be resistant to various types of inclement weather. More specifically, it is an aim of the invention to protect the penta-head bolt from rain, ice and snow.

A still further object of the invention is to provide a locking unit that is riveted in place on the enclosure so that the unit's cover not only prevents access to the penta-head bolt but also conceals the rivets that mount the unit in place, thereby making it considerably more difficult for the locking unit to be removed by vandals in contradistinction to a double locking system where the individual parts comprising the system are continuously exposed to view.

Another object of the invention is to provide a locking system utilizing a locking unit that will be aesthetically attractive. In this regard, the previous use of both a hasp-type fastener requiring a padlock plus the use of a recessed penta-head bolt have detracted somewhat from the overall appearance of the enclosure housing the electrical equipment to be protected.

Also, my invention has for an object the simplification of the system's mounting procedure, it being only necessary to attach a single unit in contrast to what has amounted to two separate and distinct units in the past. In addition to a saving of labor as far as the mounting procedure is concerned, the cost of the needed hardware constituting my locking system is only insignificantly increased over the double locking systems known to me that have been previously employed.

Briefly, my invention envisages a two-step locking system employing a locking unit having a panel or plate that is riveted to one wall of one of the components constituting the enclosure containing the electrical equipment to be protected. The panel or plate has a keeper projecting therefrom, the keeper having a sufficient length so as to extend through a slot provided in a cover that is hingedly connected to the panel or plate. Secured to the panel or plate is a sleeve which encircles a penta-head bolt, thereby requiring a special wrench to be employed after the padlock has been removed from the keeper and the cover swung open to provide access to the bolt. The bolt extends through the panel or plate, through the wall of the enclosure and engages a bracket attached to the other component of the enclosure, the bracket having an aligned threaded hole formed therein so that engagement of the penta-head bolt in the threaded hole prevents entry into the enclosure.

Hence, the padlock must first be removed from the keeper in order to open the cover. Once the cover has been opened, then the penta-head bolt is accessible but a specially configured socket wrench is needed in order to complete the opening of the enclosure in order to obtain access to the electrical equipment contained therein. Thus, two successive and distinct unlocking steps must be performed in order to gain entry into the enclosure containing the electrical equipment.

BRIEF DESCRIPTION OF THE DRAWINGS

FIG. 2 is a greatly enlarged view of the unit providing the locking action, the padlock shown in FIG. 1 having been removed and the cover swung into an open position to reveal the otherwise concealed penta-head bolt;

FIG. 3 is a vertical sectional view taken in the direction of line 3—3 of FIG. 1 with the interiorly located bracket in the background;

DESCRIPTION OF THE PREFERRED EMBODIMENT

Figure 1:
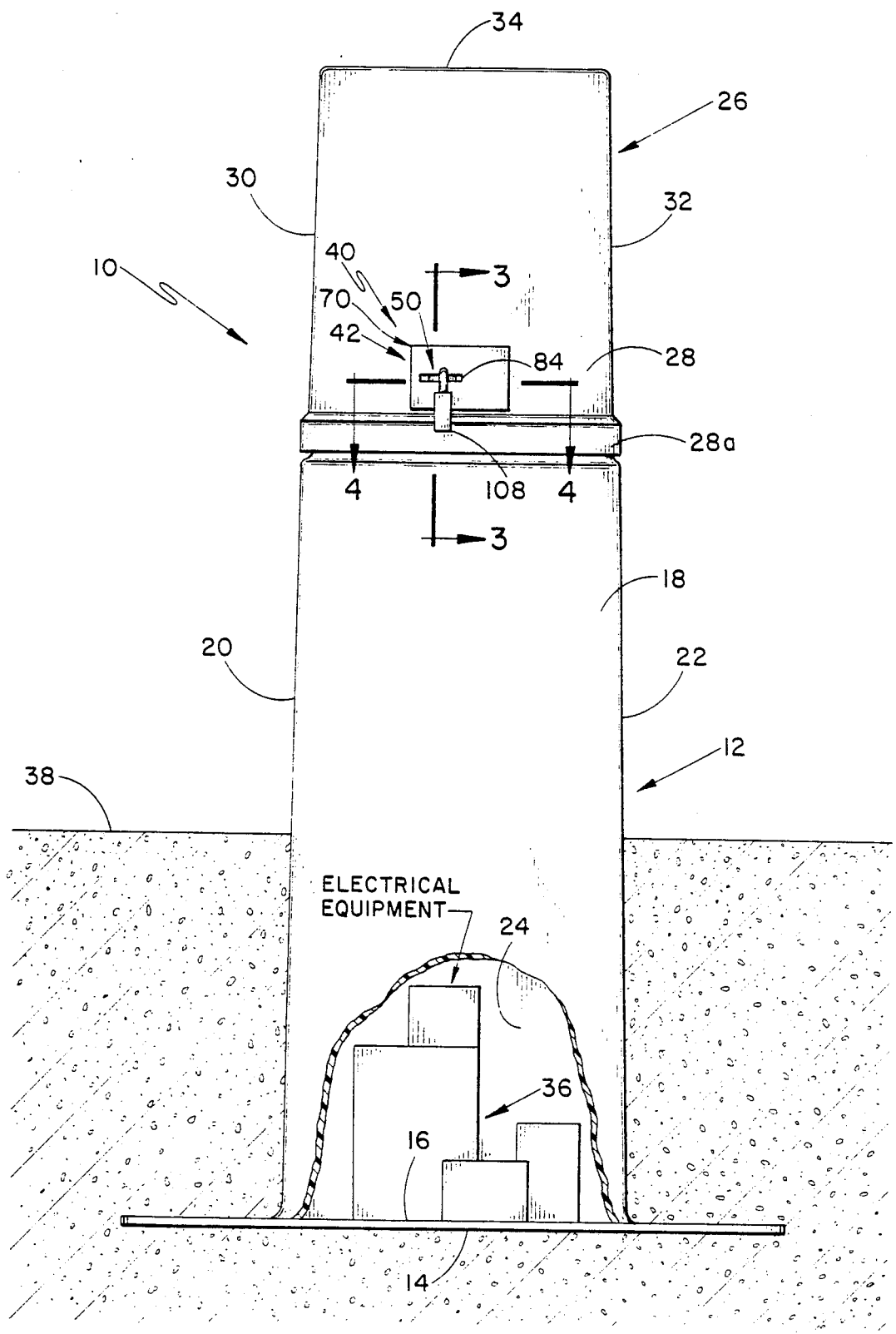
FIG. 1 is a front elevational view of an upright pedestal incorporating therein my two-step locking system with a portion of the pedestal's base having been removed in order to expose to view several items of conventional electrical equipment contained therein, the electrical items appearing in block form.
Figure 4:
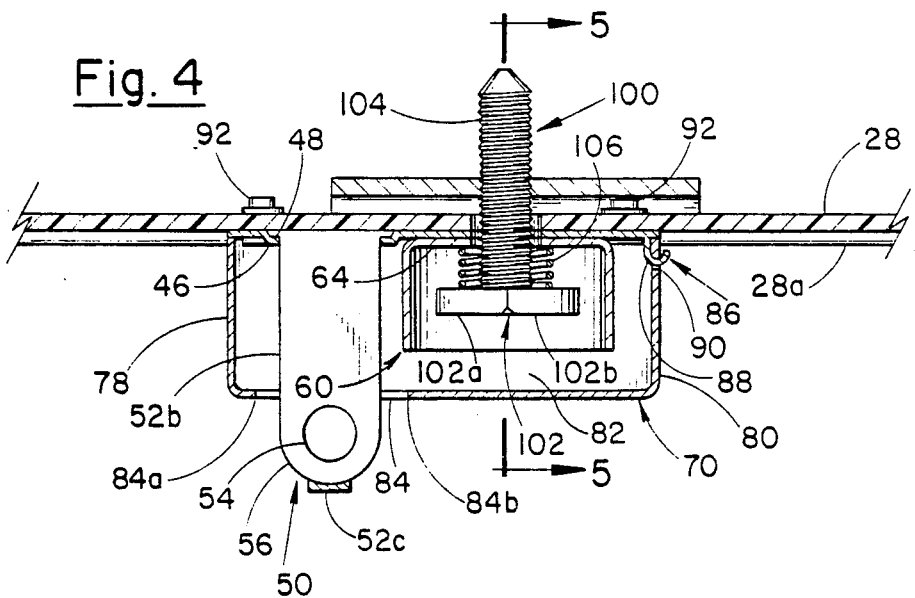
FIG. 4 is a horizontal sectional view taken in the direction of line 4—4 of FIG. 1.

While my locking system is capable of being installed on a variety of enclosures for housing therein various types of electrical equipment, the enclosure selected for illustrating the invention constitutes an upright pedestal denoted generally by the reference numeral 10. The pedestal 10 customarily includes a base or lower component 12 in the form of a fiberglass shell having a flange 14 extending outwardly from a bottom wall 16. The base or component 12 also includes a front wall 18, side walls 20, 22 and a rear wall 24.

The upright pedestal 10 further includes a lid or upper component 26 in the form of a second fiberglass shell having a front wall 28, side walls 30, 32, and a top wall 34. The rear wall does not appear.

It will be appreciated that the lid or upper component 26 is completely removable from the base or lower component 12; however, in some instances the lid 26 is hinged to the base 12. In this situation, however, there is a telescopic or slip fit between the two components 12, 26. To provide the telescopic fit and to make it weatherproof, the front wall 18 is inset at 18a and the front wall 28 is outset at 28a. The telescopic fit, as far as the front walls 18 and 28 are concerned, appears in FIGS. 3, 5 and 6; however, the same telescopic engagement, quite obviously, is employed with respect to the other three walls of the two components 12 and 26.

It will be noted that a portion of the wall 18 has been broken away in FIG. 1 in order to expose to view typical electrical equipment, shown in block form and indicated generally by the reference numeral 36. Inasmuch as the upright pedestal 10 is typically installed with the flange 14 of the lower component 12 beneath the surface of the ground, FIG. 1 is intended to show the embedded relationship. Therefore, the ground appearing in FIG. 1 has been assigned the reference numeral 38.

The two-step locking system exemplifying my invention has been denoted in its entirety by the reference numeral 40. Playing an important part in the realization of the invention is what will be termed a dual locking unit 42, preferably of brass. The box-like unit 42 includes a panel or plate 44 having an embossed portion 46 provided with a slot 48 therein. A staple-like keeper 50 projects outwardly through the slot 48. More specifically, the keeper 50 is fabricated from strip stock 52 having confronting strip portions 52a, 52b, a narrowed bight or neck portion 52c, an upturned tab or ear 52d and a downturned tab or ear 52e. The tabs or ears 52d, 52e are held in place by the embossed portion 46, preferably being secured to the back side thereof by resistance brazing. The free end of the keeper 50 has a hole 54 punched therein for the accommodation of the shackle of a padlock yet to be referred to. It should be observed at this stage, however, that the keeper 50 has a curved edge 56 that performs a camming function that will be described hereinafter.

At this time, attention is directed to a cup-shaped member 60 having a sleeve 62 and an annular bottom 64. The bottom 64 is provided with a hole 66 that is aligned with a hole 68 formed in the panel or plate 44. Inasmuch as it is planned that the cup-shaped member 60, as well as the panel or plate 44 and the keeper 50 all be of stainless steel, the annular bottom 64 can be welded to the portion of the panel or plate 44 which it confronts.

The dual locking unit 42 additionally includes a recessed cover 70, also of stainless steel, having a front wall 72, a top wall 74, a bottom wall 76 and end walls 78, 80. By reason of the walls 72–80, a recess or void 82 is created. The front wall 72 has a horizontal slot 84 therein, the slot having ends 84a and 84b.

The cover 70 is pivotally connected to the panel or plate 44 by means of a hinge 86. The hinge 86 can be quite simple, constituting a leaf 88 having a U-shaped cross section; the U-shaped leaf 88 is integral with one end of the panel 44. Also, the hinge 86 makes use of a slot 90 in the end wall 80. In this way, the recessed cover 70, when in its closed relation, abuts or confronts the marginal portions of the panel or plate 44. The panel or plate 44 is secured to the front wall 28 of the lid or upper component 26 through the agency of a plurality of rivets 92.

Figure 5:
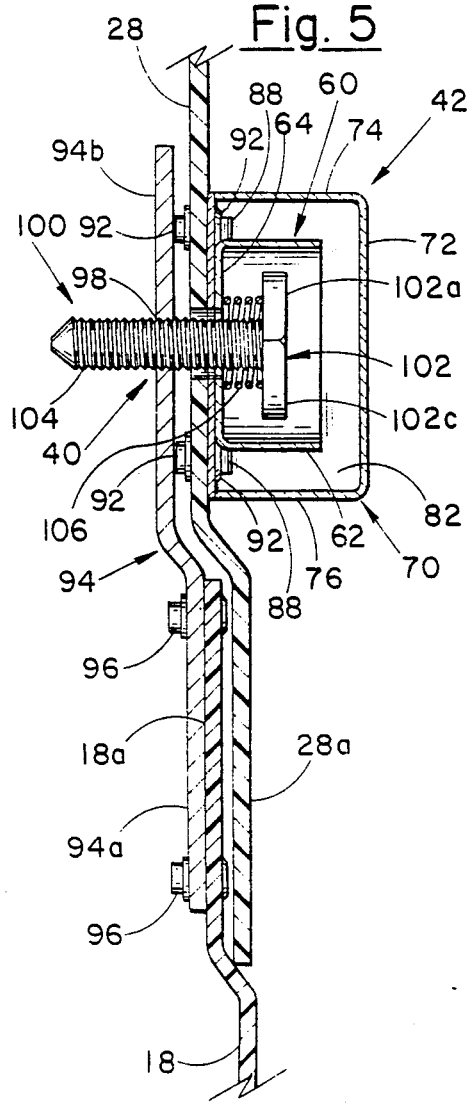
FIG. 5 is a vertical sectional view taken in the direction of line 5—5 of FIG. 4.
Figure 6:
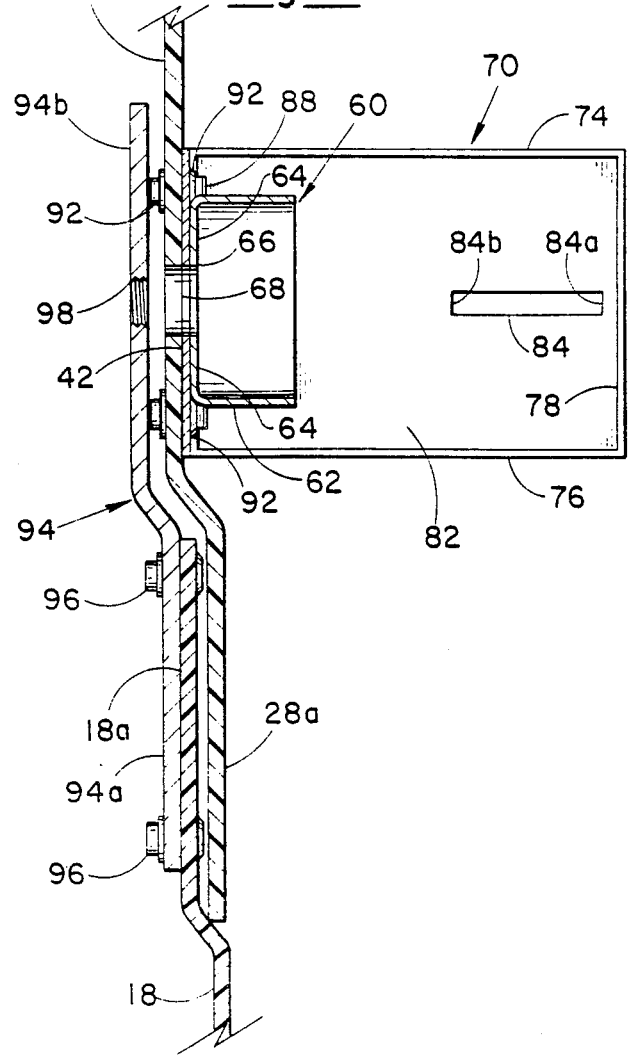
FIG. 6 is a vertical sectional view corresponding to FIG. 5 but with the cover open and the bolt completely removed so that the lid on which the locking unit is mounted can be lifted from the base to complete the entry process.

A bracket 94 in the form of a metal strip, preferably of steel, has a lower portion 94a and an upper portion 94b, the lower portion 94a is secured to the inner surface of the front wall 18 belonging to the base or lower compartment 12. The upper portion 94b is inset with respect to the lower portion 94a, as can be seen in FIGS. 3, 5 and 6, so as to accommodate the different cross sections of the two components 12 and 26, the upper component 26 having a lesser cross section than the lower component 12. The lower portion 94a of the bracket 94 is secured in place by means of rivets 96. The upper portion 94b is provided with a tapped hole 98 that is aligned or registered with the previously mentioned holes 66 and 68 when the lid or upper component 26 is in place on the base or lower component 12.

My two-step locking system 40 further includes a bolt 100 having a specially configured head 102 thereon, the head actually being a penta-head having five sides 102a, 102b, 102c, 102d and 102e. It is the threaded shank 104 of the bolt 100 that engages the threaded or tapped hole 98 when the lid or upper component 26 is closing the upwardly facing opening of the base or lower component 12. There is a coil spring 106 that normally biases the head 102 outwardly. However, when a complementally configured five-sided socket wrench (not shown) is employed, the coil spring 106 is simply compressed to whatever extent is needed in order to allow threaded engagement between its shank 104 and the tapped hole 98 to be established. The sleeve 62 belonging to the cup-shaped member 60 encircles the head 102, providing only enough peripheral space between the head 102 and the inner surface of the sleeve 62 for the accommodation of the special socket wrench. It is not believed necessary to show the socket wrench. All that need be appreciated is that once the recessed cover 70 is swung open, as in FIG. 2, then access to the head 102 of the bolt 100 can be had so that the bolt 100 can be removed to produce the relation appearing in FIG. 6.

Before the cover 70 can be opened, however, a conventional padlock 108 must be removed, the shackle of which extends through the hole 54 in the keeper 50. Until the padlock 108 is removed, the recessed cover 70 cannot be swung open and when closed completely conceals the five-sided head 102 of the bolt 100. Thus, any unauthorized person wishing to tamper with the enclosure 10 would first have to remove the padlock 108 and would then be surprised to learn that a special wrench would be needed in order to actually gain entry into the pedestal 10 because the lid or upper component 26 cannot be lifted from the base or lower component 12 until the bolt 100 is unscrewed and removed. The removal of the bolt 100 can only be achieved with the specially configured socket wrench, and before that the cover 70 must first be swung open which requires that the padlock 108 be unlocked and removed.

At times, the padlock 108 may temporarily not be employed. In other words, the penta-head bolt 100 can be relied upon as the sole means for preventing an unauthorized access into the upright pedestal 10, such as when skilled utility employees are working in the area. Under such conditions, though, one normally does not wish to have the recessed cover 70 unintentionally swing open. This is prevented by the earlier-mentioned curved edge 56. As the cover 70 is intentionally swung from its closed position, as illustrated in FIG. 1, to its open position, as illustrated in FIG. 2, the left end 84a of the slot 84 located in the front wall 72 of the cover 70 wipes or cams against the curved edge 56. In other words, there is just enough frictional resistance provided so that the cover 70 remains closed until manually opened. In this way, the cover 70, while not preventing access to the bolt 100, nonetheless will preserve a neater appearance than if the cover 70 were allowed to inadvertently and unintentionally swing to its open position.

It will be appreciated that the dimensions of the recessed cover 70 are relatively important. More specifically, the walls 74, 76, 78, 80 should be dimensioned so that when the cover 70 is closed, that is, confronting the panel or plate 44, then the keeper 50 extends through the slot 84 sufficiently so that the punched hole 54 is available for receiving the shackle of the padlock 108. On the other hand, the distance the sleeve 62 of the cup-shaped member 60 projects from the panel or plate 44 must be less than the length of the keeper 50 and less than the forwardly extending dimensions of the walls 74–80. In this way, the sleeve 62 and the bolt head 102 that is recessed within the sleeve 62 when the shank 104 of the bolt 100 is threadedly engaged in the tapped hole 98 are totally enclosed and concealed by the recessed cover 70. In other words, there must be no obstructive interference between the front wall 72 of the cover 70 and the sleeve 62 when the cover 70 is closed, the dimensions of the cover 70 being such as to achieve this. In addition, the rivets 92 are concealed and unavailable for unauthorized removal when the cover 70 is locked in its closed position.

In summation, my locking system 40 comprised of the unit 42 and bracket 94 is truly a two-step system. First, the padlock 108 must be unlocked and removed; secondly, the penta-head bolt 100 must be unscrewed and removed. It is only after these two separate and distinct steps have been performed in sequence that entry to the interior of the pedestal 10 can be realized, because until both steps have been completed, the lid or upper component 26 cannot be lifted from its base or lower component 12.

I claim:

1. A two-step locking system for a two-component enclosure containing electrical equipment therein comprising a box-like unit including a plate affixed to the outer surface of one of said components, a keeper projecting outwardly from said plate having a hole therein for receiving the shackle of a padlock, a sleeve projecting outwardly from said plate a lesser distance than said keeper, a bolt having a five-sided head received in said sleeve and projecting freely inwardly through a hole in said plate into the interior of said one component, a coil spring between said head and plate acting against said head to bias said head in a direction away from said plate, a recessed cover having a slot therein through which said keeper extends when said cover confronts said plate, said sleeve being concealed when said cover confronts said plate, and said system further including a strip having a first end portion thereof anchored to the inner surface of the other component of said enclosure and having a second end portion thereof projecting upwardly beyond said other component into said one component and said second end portion being aligned with said bolt, said aligned second portion of said strip having a threaded hole for the threaded engagement of said bolt therein, whereby said coil spring acts against said head to resiliently urge said bolt in a non-engaging direction with respect to the first end portion of said strip, said coil spring compressing to permit engagement of said bolt with the threaded hole in said strip when said head is pressed in a direction toward said first end portion of said strip.

2. In combination, upper and lower separable components forming an enclosure for electrical equipment, said upper component having an outset lower first portion and having a first hole in a second portion above said first portion and said lower component having an inset upper portion telescopically received in said outset lower portion, a plate secured to the outer side of said second portion of said upper component, said plate having a second hole aligned with said first hole, bracket means including a strip having a lower end portion and an inset upper portion extending upwardly from its said lower portion, rivet means extending inwardly through the inset upper portion of said lower component from the outer surface thereof and continuing through the lower portion of said strip whereby said strip is attached to the inner side of said inset upper portion, the outset lower portion of said upper component overlapping the inset upper portion of said lower component and concealing said rivet means when the inset upper portion of said lower component is telescopically received in the outset lower portion of said upper component, the upper portion of said strip having a third hole aligned with said first and second holes, said third hole being threaded, bolt means extending freely through said first and second holes into said third hole to prevent separation of said upper and lower components, a keeper projecting from said plate, said keeper residing in a horizontal plane and having a curved free end, a recessed cover having a horizontal slot therein through which said keeper extends when said cover confronts said plate, and vertical hinge means connecting one end of said cover to one end of said plate such that the end of the slot in said cover is farther from said hinge means and cams against said curved edge as said cover is being either opened or closed, whereby access to said bolt means is prevented when said cover confronts said panel and the shackle of a padlock is engaged with said keeper so that the telescopic relationship between said lower and upper portions is maintained to thereby prevent said access to the interior of said upper and lower components.

* * * * *